(12) United States Patent
Huang et al.

(10) Patent No.: US 8,181,128 B2
(45) Date of Patent: May 15, 2012

(54) METHOD AND APPARATUS FOR DETERMINING A PHOTOLITHOGRAPHY PROCESS MODEL WHICH MODELS THE INFLUENCE OF TOPOGRAPHY VARIATIONS

(75) Inventors: Jensheng Huang, San Jose, CA (US); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 763 days.

(21) Appl. No.: 12/250,391

(22) Filed: Oct. 13, 2008

(65) Prior Publication Data
US 2010/0095264 A1 Apr. 15, 2010

(51) Int. Cl.
*G06F 17/50* (2006.01)
(52) U.S. Cl. ............ 716/55; 716/111; 716/139
(58) Field of Classification Search ............ 716/55, 716/111, 139
See application file for complete search history.

(56) References Cited

U.S. PATENT DOCUMENTS
7,921,383 B1 * 4/2011 Wei .............. 716/136

FOREIGN PATENT DOCUMENTS
EP 1696269 A2 8/2006
EP 1862857 A2 12/2007

* cited by examiner

*Primary Examiner* — Thuan Do
(74) *Attorney, Agent, or Firm* — Park, Vaughan, Fleming & Dowler LLP; Laxman Sahasrabuddhe

(57) ABSTRACT

One embodiment provides a system for determining a process model for a photolithography process. The photolithography process can use multiple exposure-and-development steps to create features on a wafer. When the photolithography process exposes the wafer to a layout, the wafer can include topography variations which were caused by previous exposure-and-development steps. The process model can be used to predict patterns that are created on the wafer when the wafer is exposed to a second layout, wherein the wafer includes topography variations that were caused by resist features that were created when the wafer was exposed to a first layout. The process model can include a first term and a second term, wherein the first term is convolved with a sum of the first layout and the second layout, and wherein the second term is convolved with the second layout.

15 Claims, 4 Drawing Sheets

METHOD AND APPARATUS FOR DETERMINING A PHOTOLITHOGRAPHY PROCESS MODEL WHICH MODELS THE INFLUENCE OF TOPOGRAPHY VARIATIONS

BACKGROUND

1. Field of the Invention

The present invention generally relates to electronic design automation. More specifically, the present invention relates to methods and apparatuses for determining a photolithography process model which models the influence of topography variations.

2. Related Art

Rapid advances in computing technology can largely be attributed to improvements in semiconductor manufacturing technologies which have made it possible to integrate tens of millions of devices onto a single chip.

Process models are commonly used to model semiconductor manufacturing processes. A process model can be used in a number of applications during the design of a semiconductor chip. For example, process models are commonly used for making corrections to layouts to compensate for undesirable effects of semiconductor manufacturing processes.

Inaccuracies in the process model can negatively affect the efficacy of applications which use these models. For example, inaccuracies in a photolithography process model can reduce the efficacy of optical proximity correction (OPC). Some photolithography processes use multiple exposure-and-development steps to print the desired features. Conventional process models do not accurately model such photolithography processes. Hence, it is desirable to determine accurate process models for photolithography processes that use multiple exposure-and-development steps.

SUMMARY

One embodiment of the present invention provides a system that determines a photolithography process model which models the influence of topography variations. Conventional photolithography process models assume that the wafer's surface is flat. However, this assumption may be false for photolithography processes which use multiple exposure-and-development steps. Specifically, the wafer's surface may be flat when the first exposure-and-development step is performed, but for subsequent exposure-and-development steps, the wafer's surface may have topography variations.

Specifically, the photolithography process can expose a wafer using a first layout and later expose the wafer using a second layout. When the wafer is exposed using the second layout, the wafer's surface can include topography variations which are caused by resist features that were created when the wafer was exposed using the first layout.

Some embodiments of the present invention can use a topography term to model the influence of the topography variations on the second exposure-and-development step. Specifically, the process model can include a topography variation term which can comprise a first term and a second term. The first term can be convolved with a sum of a first layout function and a second layout function, wherein the first layout function represents the first layout and the second layout function represents the second layout. The second term can be convolved with the second layout function.

In some embodiments, the first term and the second term can model the second exposure-and-development process at different image depths. Specifically, the first term can model the aerial image generated by the second exposure-and-development process at the wafer's surface, and the second term can model the aerial image generated by the second exposure-and-development process below the wafer's surface.

Further, in some embodiments, the first term and the second term use only lower-order Zernike polynomials to make the process model more efficient. Specifically, the lower-order Zernike polynomials used in the first term and the second term may not be sufficient to accurately model the aerial image. However, since the topography variations are relatively smooth, their influence can be modeled with adequate accuracy by using only lower-order Zernike polynomials.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
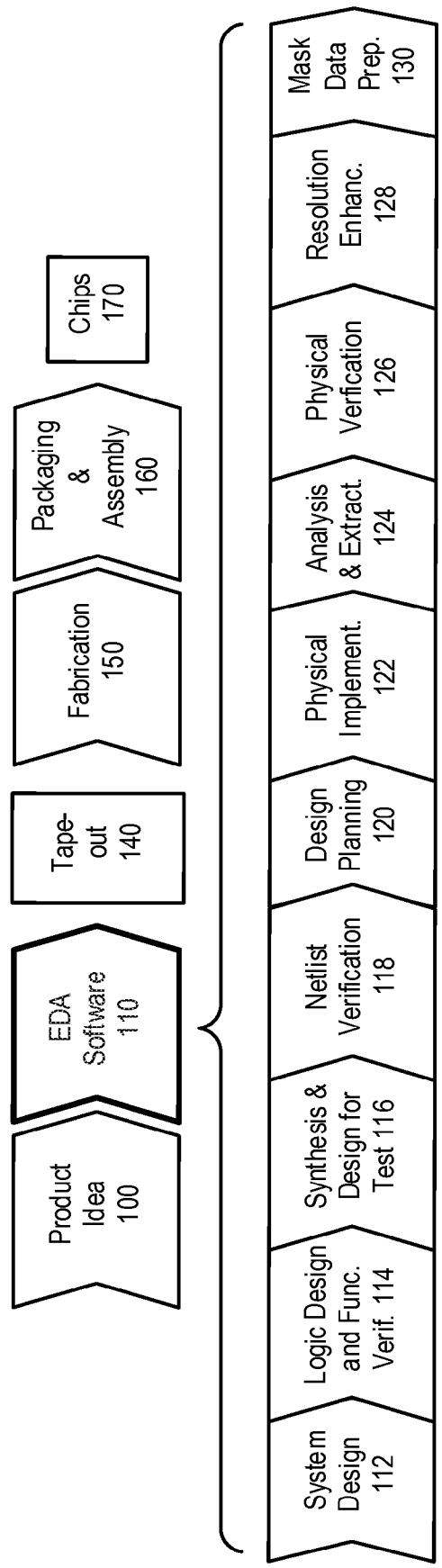
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process usually starts with a product idea (step 100) which is realized using an EDA process (step 110). Once the design is finalized, it is usually taped-out (event 140) and goes through the fabrication process (step 150) and packaging and assembly processes (step 160) to produce the finished chips (result 170).

The EDA process (step 110) comprises steps 112-130, which are described below for illustrative purposes only and are not meant to limit the present invention. Specifically, an actual integrated circuit design may require the designer to perform the design steps in a different sequence than the sequence described below.

System design (step 112): In this step, the designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber®, System Studio, and DesignWare®.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS®, Vera®, DesignWare®, Magellan™, Formality®, ESP and Leda®.

Synthesis and design for test (step 116): The VHDL/Verilog can be translated to a netlist in this stage. The netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

Netlist verification (step 118): In this step, the netlist is checked for compliance with timing constraints and for correspondence with the VHDL/Verilog source code. Exemplary EDA software products from Synopsys, Inc. that can be used at this step include Formality®, PrimeTime®, and VCS®.

Design planning (step 120): Here, an overall floorplan for the chip is constructed and analyzed for timing and top-level routing. Exemplary EDA software products from Synopsys, Inc. that can be used at this step include Astro™ and IC Compiler products.

Physical implementation (step 122): The placement (positioning of circuit elements) and routing (connection of the same) occurs at this step. Exemplary EDA software products from Synopsys, Inc. that can be used at this step include Astro™ and IC Compiler products.

Analysis and extraction (step 124): At this stage, the circuit function is verified at a transistor level; this, in turn, permits what-if refinement. Exemplary EDA software products from Synopsys, Inc. that can be used at this step include Astro-Rail™, PrimeRail, PrimeTime®, and Star-RCXT™.

Physical verification (step 126): In this step, the design is checked to ensure correctness for manufacturing, electrical issues, lithographic issues, and circuitry. Hercules™ is an exemplary EDA software product from Synopsys, Inc. that can be used at this step.

Resolution enhancement (step 128): This step involves geometric manipulations of the layout to improve manufacturability of the design. Exemplary EDA software products from Synopsys, Inc. that can be used at this step include Proteus/Progen, ProteusAF, and PSMGen.

Mask data preparation (step 130): This step provides the "tape-out" data for production of masks to produce finished chips. Exemplary EDA software products from Synopsys, Inc. that can be used at this step include the CATS® family of products.

Some embodiments of the present invention can be used during the resolution enhancement (step 128).

Process Models

A process model models the behavior of one or more semiconductor manufacturing processes which usually involve complex physical and chemical interactions. A process model can be represented as a weighted sum of kernels, wherein the kernel coefficients are determined by fitting or calibrating the kernel coefficients and/or parameters to empirical data. The process model can include kernels which are used to model the optical system (e.g., the process model can include the kernels that are derived form the optical system's transmission cross-coefficient matrix), and it can also kernels which are used to model the physical and chemical processes that are applied to the wafer after it is exposed to the mask layout.

The empirical data is usually generated by applying the semiconductor manufacturing processes that are being modeled to one or more test layouts. For example, a photolithography process can be used to print a test layout on a wafer. Next, the empirical data can be obtained by measuring the critical dimensions (CD) of the features. An uncalibrated process model can then be fit to the empirical data to obtain a calibrated process model that models the photolithography process.

Once a process model is determined, it can be used in a number of applications during the design and manufacture of a semiconductor chip. For example, process models are typically used to support optical proximity correction (OPC) and resolution enhancement technologies (RET). These models can allow full-chip database manipulation in reasonable timeframes during the tape-out flow.

An uncalibrated process model typically includes components that are associated with parameters and/or coefficients. During calibration, the parameters and/or coefficients can be statistically fit to empirical data to obtain the final process model. A component in the process model is typically a mathematical expression that is designed to model a particular physical effect. For example, a process model may be represented as $$\sum_i (c_i \cdot k_i),$$

where $k_i$ is a component or kernel, and $c_i$ is a coefficient which is associated with $k_i$. The empirical data may include values of a desired property, e.g., the CD, at different locations in the layout. Once the process model is fit to the empirical data, it can then be used to predict the value of the desired property for other layouts.

It may be impossible to calibrate coefficient values so that the predicted data exactly matches the empirical data. Even if an exact fit was available, it may not be desirable because the resulting process model may not interpolate and/or extrapolate properly. Typically, statistical fitting techniques are used to determine the parameters and/or coefficients so that the error between the empirical data and the predicted data is minimized. In one embodiment, the system can use a least squares fitting technique to determine the parameter and/or coefficient values.

A process model is considered to be robust if it interpolates and extrapolates well, i.e., if the process model generates accurate results when it is applied to layouts that are different from the layouts that were used during the fitting process. In general, the fewer modeling functions or kernels that a process model uses, the more robust it is. However, using fewer kernels may decrease the process model's accuracy. Hence, there is usually a tradeoff between the robustness and the accuracy of a process model.

Photolithography Process Models

Process models can be determined using statistical modeling and/or physical modeling. Statistical modeling techniques typically use general purpose modeling functions with coefficients and/or parameters which are fit to empirical data. Note that the functions used by a statistical model are usually not based on the workings of the underlying physical processes; instead, they are modeling functions of general applicability which can be used to fit any kind of empirical data.

In contrast to statistical modeling, physical modeling tries to model the underlying physical processes. For example, a physical model for a photolithography process will typically include an optical model and a stack model. The optical model may model the optical system which is used to expose the resist, and the stack model may model the behavior of the stack layers (e.g., photoresist, anti-reflective-coating, etc.) when they are exposed to radiation.

Optical Model

The optical model in a photolithography process model is usually based on the Hopkins model which models the behavior of partially coherent optical systems.

Figure 2:
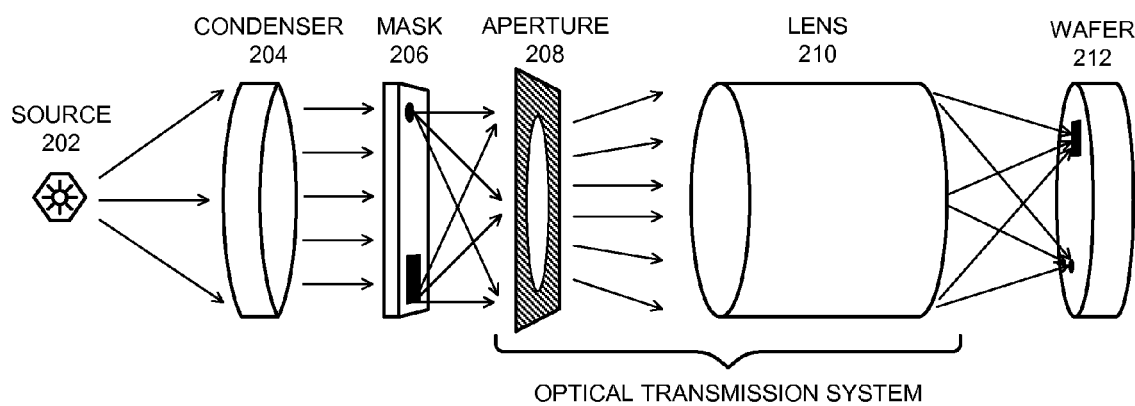
FIG. 2 illustrates a typical optical system in accordance with an embodiment of the present invention.

FIG. 2 illustrates a typical optical system in accordance with an embodiment of the present invention.

Radiation from source 202 can be collimated by condenser 204. The collimated light can then pass through mask 206, aperture 208, lens body 210, and form an image on wafer 212.

The Hopkins model can be described using the expression:

$$I(x,y) = \iiiint J(x',y';x'',y'') \hat{\times} L(x,y;x',y') \hat{\times} L^*(x,y;x'',y'') \, dx'dy'dx''dy'',$$

where, $I(x, y)$ is the optical intensity at point $(x, y)$ on the wafer, $L(x, y; x', y')$ is a lumped model of the light source and the mask, $L^*$ is the complex conjugate of $L$, and $J(x', y'; x'', y'')$ models the incoherence between two points of light on the mask. The lumped model (L) essentially treats the mask as an array of light sources. In particular, $L(x, y; x', y')$ models point $(x', y')$ on the mask as a point source, and $J(x', y'; x'', y'')$ models the incoherence between the light emanating from points $(x', y')$ and $(x'', y'')$ on the mask. The lumped model (L) can be represented as a convolution between the mask and the source. For example, the lumped model can be represented using a mask model and a source model as follows:

$$L(x,y;x',y') = M(x',y') \otimes K(x,y;x',y'),$$

where $M(x', y')$ models the mask and $K(x, y; x', y')$ models the source.

The Hopkins model can be used to determine a 4-D (four-dimensional) matrix called the transmission cross-coefficient (TCC) matrix which models the optical system. The TCC matrix can then be represented using a set of orthogonal 2-D (two-dimensional) kernels. The set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, 2nd Edition, Dover Publications, 1989.

In one embodiment, the system can use a set of orthogonal functions called Zernike polynomials to represent the optical system. Zernike polynomials are made up of terms that are of the same form as the types of aberrations often observed in optical systems. For example, one Zernike polynomial may be associated with defocus, while another may be associated with tilt, etc. The optical system can be represented using the expression $$\sum_i (c_i \cdot z_i),$$

where $z_i$ is a Zernike polynomial and $c_i$ is an optical coefficient which is associated with $z_i$.

One embodiment uses the Zernike polynomials in the optical model to also model the stack layers. Specifically, the stack model uses the same orthogonal functions as the optical model, but with different parameters and/or coefficients. The intuition behind using the optical model for modeling the behavior of the stack is as follows: since the optical model is used to describe the behavior of light in the fluid phase medium, the same model can also be used to describe the behavior of light in the stack medium. Note that some parameters in the stack model may be determined using physical parameters, such as photoresist thickness, anti-reflective-coating (ARC) thickness, ARC refractive index, ARC diffusion parameters, etc.

The foregoing descriptions of a photolithography process model have been presented only for purposes of illustration and description. They are not intended to be exhaustive or to limit the present invention to the forms disclosed. Accordingly, many modifications and variations will be apparent to practitioners skilled in the art.

Double Patterning

Conventional photolithography processes are close to reaching their physical limit in terms of the minimum feature size that they can print. Hence, the semiconductor industry is actively considering various technologies which will enable feature sizes to be miniaturized even further. One such technology is called double patterning, which generally refers to a photolithography process which uses multiple exposures and/or development steps to create the desired features.

Figure 3A:
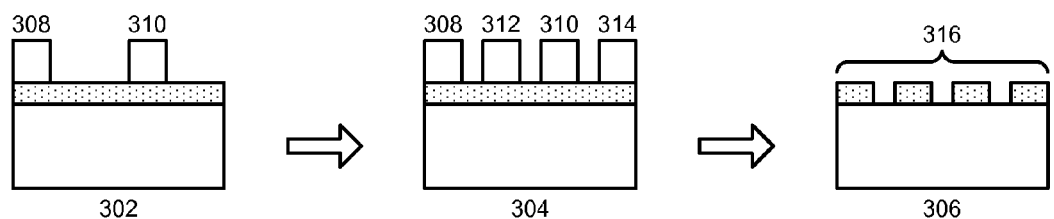
FIG. 3A illustrates a photolithography process which uses multiple exposure-and-development steps and a single etch step in accordance with an embodiment of the present invention.

FIG. 3A illustrates a photolithography process which uses multiple exposure-and-development steps and a single etch step in accordance with an embodiment of the present invention.

In step 302, the wafer is subjected to a first exposure-and-development process to create resist features 308 and 310. Next, in step 304, the wafer is subjected to a second exposure-and-development process to create resist features 312 and 314. In step 306, the wafer can be subjected to an etch process to create features 316 on the wafer's surface. (Note that the term "wafer's surface" refers to the surface of the topmost layer that is currently present on the wafer.)

In this manner, a double-patterning process can use multiple exposure-and-development steps to create features that are smaller than the smallest feature that can be printed by using a single exposure-and-development step.

The double-patterning process shown in FIG. 3A has been presented only for purposes of illustration and description, and it is just one of many possible double-patterning processes. For example, the resist features that were created by the first exposure-and-development process can be "frozen" so that the "frozen" resist features are resistant to chemical and physical processes that the wafer undergoes during the second exposure-and-development step.

Figure 3B:
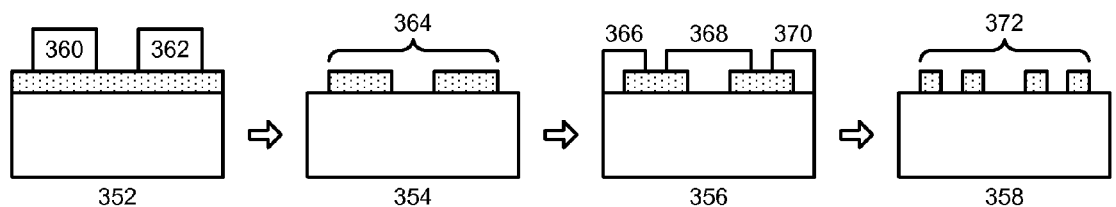
FIG. 3B illustrates a photolithography process which uses multiple exposure, development, and etch steps in accordance with an embodiment of the present invention.

Furthermore, some double-patterning processes may use a different number or a different sequence of exposure, development, and etch processes. Specifically, FIG. 3B illustrates a photolithography process which uses multiple exposure, development, and etch steps in accordance with an embodiment of the present invention.

In step 352, the wafer is subjected to a first exposure-and-development process to create resist features 360 and 362.

Next, in step 354, the wafer is subjected to an etch process to create features 364 on the wafer's surface.

In step 356, another layer of resist is coated on the wafer's surface, and the wafer is subjected to a second exposure-and-development process to create resist features 366, 368, and 370. Next, in step 358 the wafer is again subjected to an etch process to create features 372 on the wafer's surface.

Regardless of which double-patterning process is used, the system typically receives a layout with patterns which cannot be printed using a single exposure-and-development step. The system then determines two or more layouts which are used to create the desired features by using multiple exposure-and-development steps. For example, in FIG. 3A, a first layout can be used to create resist features 308 and 310, and a second layout can be used to create resist features 312 and 314.

Furthermore, regardless of which double-patterning process is used, the second (or third, fourth, etc.) exposure-and-development step is usually performed on a wafer whose surface has topography variations which were caused by the previous exposure-and-development steps.

Figure 3C:
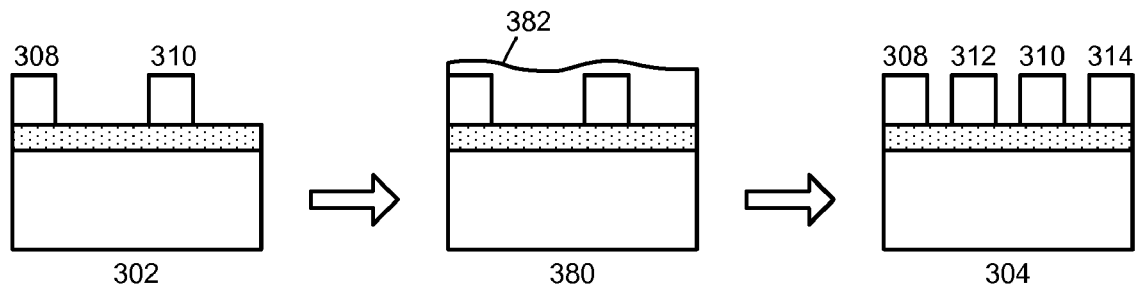
FIG. 3C illustrates topography variations on a wafer's surface during an exposure-and-development step in accordance with an embodiment of the present invention.

FIG. 3C illustrates topography variations on a wafer's surface during an exposure-and-development step in accordance with an embodiment of the present invention. Specifically, FIG. 3C illustrates the second exposure-and-development process in the double-patterning process shown in FIG. 3A.

Resist features 308 and 310 were created by a first exposure-and-development process by using a first layout. In step 380, the wafer is coated with resist layer 382, and exposed using a second layout. Note that resist layer 382 has topography variations because the resist layer is coated on top of existing resist features that were created by previous exposure-and-development processes.

The foregoing descriptions of double-patterning processes have been presented for illustrating some situations in which the wafer's surface may have topography variations. However, embodiments of the present invention are not limited to double-patterning processes. Specifically, it will be apparent to practitioners skilled in the art that embodiments of the present invention can be used whenever we want to model the influence of topography variations on a photolithography process.

Modeling the Influence of Topography Variations

Topography variations on the wafer's surface influence the aerial image in at least two ways. First, topography variations cause diffraction because of light rays that are reflected off the slopes. For example, in FIG. 3C, the aerial image for resist features 312 and 314 will be affected by light rays that are reflected off the slopes of the "hills" and "valleys" in resist layer 382. Second, topography variations cause portions of the aerial image to be formed at distances that are different from the nominal image depth. For example, the aerial images that are formed at the top of the "hills" are at a different exposure depth than the images that are formed at the bottom of the "valleys."

Since topography variations influence the aerial image, they influence the dimensions and shapes of the features that are eventually printed on the wafer. The effect of these topography variations is non-negligible at current integration densities and is expected to become even more pronounced in the future. Hence, it is desirable to determine methods and techniques for modeling the influence of topography variations.

Note that it is possible to simulate the effect of topography variations by performing a full-blown simulation based on Maxwell's equations. However, this approach is impractical because the simulation can take a very long time to complete. For example, according to one estimate, a full-blown simulation for a 45 nm layer may take up to 3000 years to complete.

One embodiment of the present invention provides systems and techniques for efficiently modeling the influence of topography variations on a photolithography process. Specifically, an embodiment uses the following insights to efficiently model the influence of topography variations.

The first insight is to model the influence of topography variations by using multiple photolithography models which model the aerial image at different exposure depths. Note that conventional process models typically determine the aerial image at the nominal image depth. However, since topography variations cause the aerial image to form at different exposure depths, some embodiments of the present invention model this effect by using multiple photolithography models that model the aerial image at different exposure depths. Note that, since the optical model is usually a physical model (e.g., based on the Hopkins model), the exposure depth of the photolithography process model can be changed by changing appropriate parameters in the optical model.

The second insight is to convolve the topography variation term with a weighted sum of the first layout function and the second layout function, wherein the first layout function represents the first layout which is used in the first exposure-and-development process, and the second layout function represents the second layout which is used in the second exposure-and-development process.

Note that the patterns on the first layout are related to the topography variations on the wafer's surface. Hence, convolving the topography term with a weighted sum of the first layout function and the second layout function can help to model the influence of the topography variations. This insight is counter-intuitive because conventional process models convolve the process model kernels with the layout function that is being used in the exposure-and-development process. In other words, since the first layout is not used during the second exposure-and-development process, it is counter-intuitive to use the first layout function to model the patterns that are generated by the second exposure-and-development process.

The third insight is to make the process model more efficient by using only lower-order Zernike polynomials to model the influence of topography variations. Again, this insight is counter-intuitive because we typically need to use higher-order Zernike polynomials to accurately model the aerial image. However, since we know that the topography variations are relatively smooth, we can omit the higher-order Zernike polynomials, thereby speeding up the simulation speed.

Specifically, in one embodiment, the aerial image intensity, $I_2$, for the second exposure-and-development process can be expressed as:

$$I_2 = P_2 \otimes M_2 + I_T,$$

where, $P_2$ is a process model which models the second exposure-and-development process without taking into account the influence of topography variations, $M_2$ is a function that represents the second layout, and $I_T$ is the influence of the topography variations on the aerial image intensity.

The influence of the topography variations, $I_T$, can be expressed as:

$$I_T = P_{2a} \otimes (M_1 + M_2) - P_{2b} \otimes M_2,$$

where, $P_{2a}$ is a process model that models the second exposure-and-development process at a first image depth, $P_{2b}$ is a process model that models the second exposure-and-development process at a second image depth, and $M_1$ is a function that represents the first layout. The expression for $I_T$ can be viewed as a way to isolate the influence of $M_1$ (which is representative of the topography variations) on the second exposure-and-development process by creating an interference pattern using $M_1$ and $M_2$, and then partially removing the contribution of $M_2$.

Process models $P_2$, $P_{2a}$, and $P_{2b}$ can be expressed as weighted sums of Zernike polynomials. $P_2$, $P_{2a}$, and $P_{2b}$ may use different sets of Zernike polynomials and different sets of coefficient values. In one embodiment, $P_{2a}$ and $P_{2b}$ use only lower-order Zernike polynomials. Specifically, in one embodiment, $P_2$ uses at least one Zernike polynomial that is of a higher order than the highest order Zernike polynomial used in $P_{2a}$ or $P_{2b}$.

In one embodiment, $P_2$ is determined by fitting the Zernike coefficients using a first set of process data which is generated by using only the second exposure-and-development process. In other words, to fit $P_2$, we don't use the first exposure-and-development process; instead, we generate a first set of process data by directly using the second exposure-and-development process. Once $P_2$ is determined, a second set of process data can be generated by using the first exposure-and-development process followed by the second exposure-and-development process. The second set of process data can then be used to fit the Zernike coefficients for $P_{2a}$ and $P_{2b}$. In another embodiment, the first set of process data is not generated; instead, the system uses the second set of process data to fit the Zernike coefficients for $P_2$, $P_{2a}$, and $P_{2b}$.

The foregoing descriptions have been presented only for purposes of illustration and description, and many modifications and variations will be apparent to practitioners skilled in the art. For example, in one variation, $P_{2a}$ can be convolved with a weighted sum of $M_1$ and $M_2$. In other words, $I_T$ can be represented as $I_T = P_{2a} \otimes (\alpha \cdot M_1 + \beta \cdot M_2) - P_{2b} \otimes M_2$, where $\alpha$ and $\beta$ are weights which can be determined during model fitting.

Process for Determining and Using a Process Model

Figure 4:
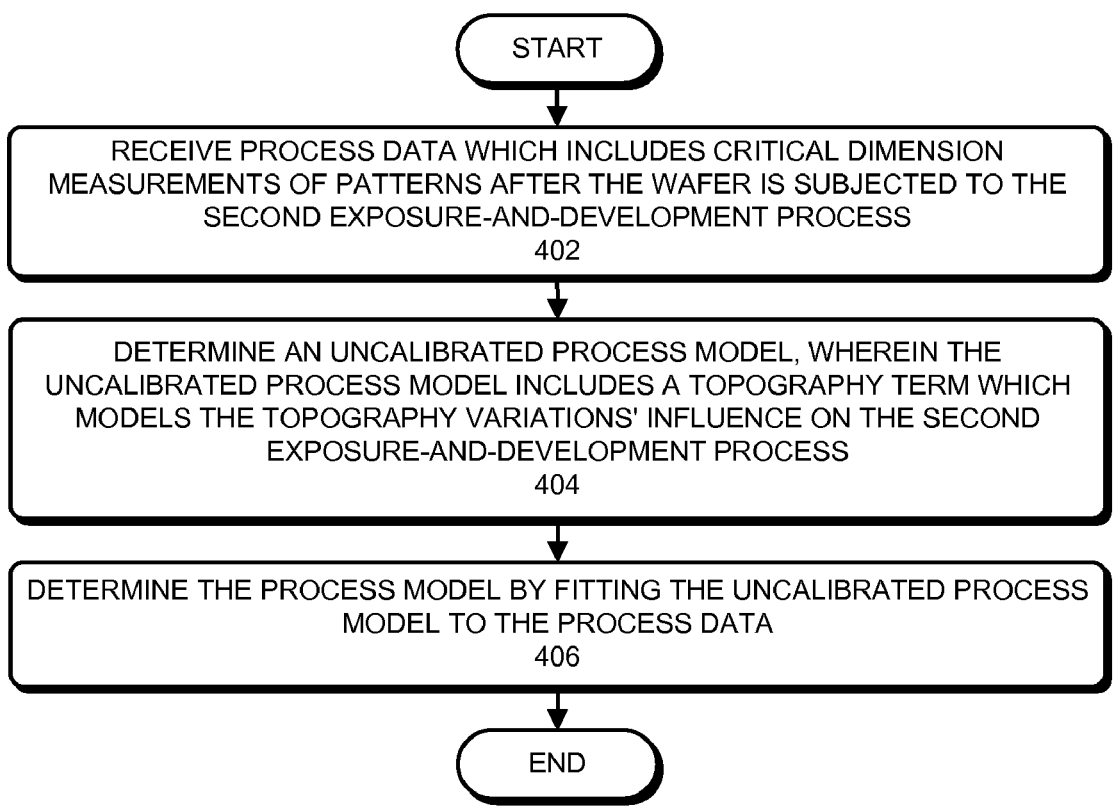
FIG. 4 presents a flowchart that illustrates a process for determining a photolithography process model which models the influence of topography variations in accordance with an embodiment of the present invention.

FIG. 4 presents a flowchart that illustrates a process for determining a photolithography process model which models the influence of topography variations in accordance with an embodiment of the present invention.

As described above, some photolithography processes use multiple exposure-and-development processes to create features on a layer. Specifically, a photolithography process can use a first layout to subject a wafer to a first exposure-and-development process, and later use a second layout to subject the wafer to a second exposure-and-development process. When the wafer is subjected to the second exposure-and-development process, the wafer's surface can include topography variations which are created at least partly due to the first exposure-and-development process.

During operation, the system can receive process data which includes critical dimension measurements of patterns after the wafer is subjected to the second exposure-and-development process (step 402).

Next, the system can determine an uncalibrated process model, wherein the uncalibrated process model includes a topography term which models the topography variations' influence on the second exposure-and-development process (step 404).

In one embodiment, the topography term includes a first term and a second term, wherein the first term is convolved with a sum of a first layout function and a second layout function, wherein the first layout function represents the first layout and the second layout function represents the second layout, and wherein the second term is convolved with the second layout function.

The system can then determine the process model by fitting the uncalibrated process model to the process data (step 406).

Figure 5:
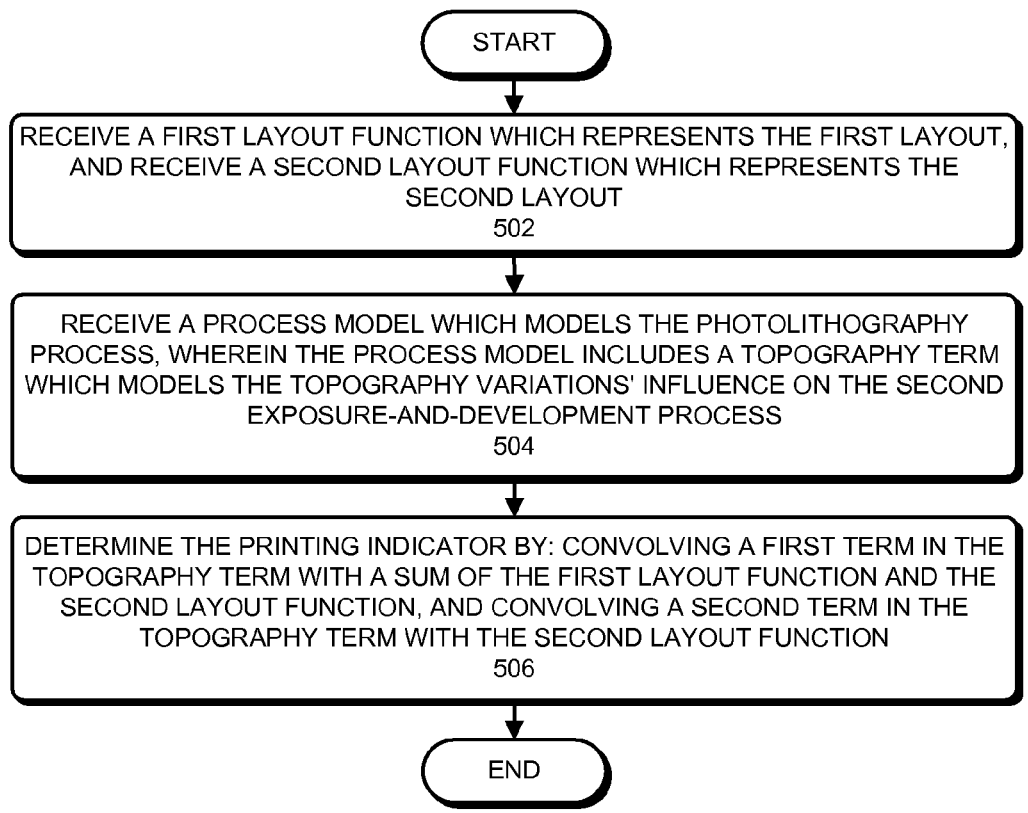
FIG. 5 presents a flowchart that illustrates how a photolithography process model can be used in accordance with an embodiment of the present invention.

FIG. 5 presents a flowchart that illustrates how a photolithography process model can be used in accordance with an embodiment of the present invention.

The process model can be used to determine a printing indicator which indicates whether a feature is expected to print at an evaluation point on a wafer when the wafer is subjected to the photolithography process.

Specifically, the process can begin by receiving a first layout function which represents the first layout, and receiving a second layout function which represents the second layout (step 502).

Next, the system can receive a process model which models the photolithography process, wherein the process model includes a topography term which models the topography variations' influence on the second exposure-and-development process (step 504).

The system can then determine the printing indicator by: convolving a first term in the topography term with a sum of the first layout function and the second layout function, and convolving a second term in the topography term with the second layout function (step 506). Note that the convolutions are performed at the evaluation point.

Next, the system can compare the printing indicator with a threshold to determine whether a feature is likely to print at the evaluation point. Specifically, in one embodiment, the printing indicator represents the aerial image intensity at a point on the wafer's surface, and the threshold represents the amount of energy required to change the characteristics of the resist by a sufficient amount so as to cause the pattern to eventually print on the wafer.

Figure 6:
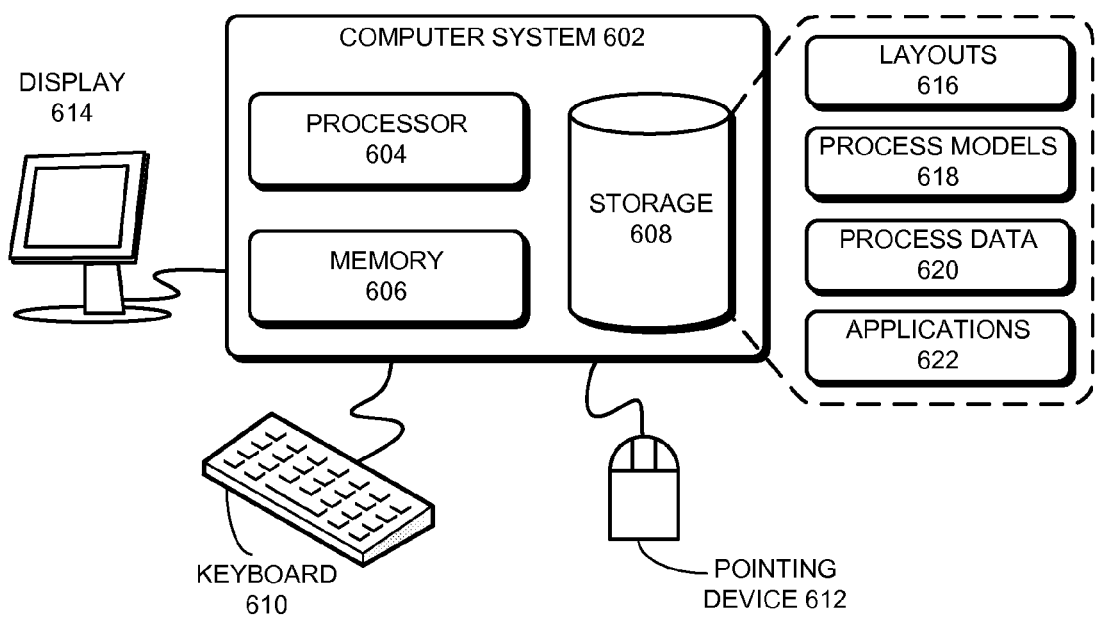
FIG. 6 illustrates a computer system in accordance with an embodiment of the present invention.

FIG. 6 illustrates a computer system in accordance with an embodiment of the present invention.

Computer system 602 comprises processor 604, memory 606, and storage device 608. Computer system 602 can be coupled with display 614, keyboard 610, and pointing device 612. Storage device 608 can store layouts 616, process models 618, process data 620, and applications 622.

Process data 620 can include critical dimension measurements of features that were printed on a wafer's surface when layouts 616 were used in a double-patterning process. Applications 622 can include instructions which when executed by processor 604 cause computer system 602 to perform a method for determining or using a process model.

During operation, computer system 602 can load applications 622 in memory 606. Next, the system can determine an uncalibrated process model, and then fit the uncalibrated process model using process data 620. Once fit, the system can store the process model in storage 608 by storing the associated parameters and/or coefficients. Specifically, in one embodiment, the system can store the process model by storing parameters, coefficients, kernel identifiers, and information that associates the parameters and coefficients with their respective kernel identifiers. A kernel identifier can be a string that identifies a kernel, or it can be an expression that represents the kernel. Next, the system can use the process model to determine a proximity correction or to predict the shape of a printed pattern.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for determining a process model for a photolithography process, wherein the photolithography process uses a first layout to subject a wafer to a first exposure-and-development process, and later uses a second layout to subject the wafer to a second exposure-and-development process, wherein when the wafer is subjected to the second exposure-and-development process, the wafer's surface includes topography variations which are created at least partly due to the first exposure-and-development process, the method comprising:
   receiving process data, wherein the process data includes critical dimension measurements of patterns after the wafer is subjected to the second exposure-and-development process;
   determining an uncalibrated process model, wherein the uncalibrated process model includes a topography term which models the topography variations' influence on the second exposure-and-development process, wherein the topography term includes a first term and a second term, wherein the first term is convolved with a sum of a first layout function and a second layout function, wherein the second term is convolved with the second layout function, and wherein the first layout function represents the first layout and the second layout function represents the second layout; and
   determining, by computer, the process model by fitting the uncalibrated process model to the process data.

2. The method of claim 1, wherein the first term and the second term model the second exposure-and-development process at different exposure depths.

3. The method of claim 1, wherein the uncalibrated process model includes a third term which models the second exposure-and-development process without taking into account the topography variations' influence, wherein the first term, the second term, and the third term are represented using weighted sums of Zernike polynomials, and wherein the third term uses at least one Zernike polynomial that is of a higher order than the first term's Zernike polynomials and the second term's Zernike polynomials.

4. The method of claim 1, wherein the photolithography process model is used during optical proximity correction.

5. The method of claim 1, wherein the photolithography process model is used for predicting a pattern's contour when the pattern is printed on the wafer.

6. A computer-readable storage medium storing instructions that when executed by a computer cause the computer to perform a method for determining a process model for a photolithography process, wherein the photolithography process uses a first layout to subject a wafer to a first exposure-and-development process, and later uses a second layout to subject the wafer to a second exposure-and-development process, wherein when the wafer is subjected to the second exposure-and-development process, the wafer's surface includes topography variations which are created at least partly due to the first exposure-and-development process, the method comprising:
   receiving process data, wherein the process data includes critical dimension measurements of patterns after the wafer is subjected to the second exposure-and-development process;
   determining an uncalibrated process model, wherein the uncalibrated process model includes a topography term which models the topography variations' influence on the second exposure-and-development process, wherein the topography term includes a first term and a second term, wherein the first term is convolved with a sum of a first layout function and a second layout function, wherein the second term is convolved with the second layout function, and wherein the first layout function represents the first layout and the second layout function represents the second layout; and
   determining the process model by fitting the uncalibrated process model to the process data.

7. The computer-readable storage medium of claim 6, wherein the first term and the second term model the second exposure-and-development process at different exposure depths.

8. The computer-readable storage medium of claim 6, wherein the uncalibrated process model includes a third term which models the second exposure-and-development process without taking into account the topography variations' influence, wherein the first term, the second term, and the third term are represented using weighted sums of Zernike polynomials, and wherein the third term uses at least one Zernike polynomial that is of a higher order than the first term's Zernike polynomials and the second term's Zernike polynomials.

9. The computer-readable storage medium of claim 6, wherein the photolithography process model is used during optical proximity correction.

10. The computer-readable storage medium of claim 6, wherein the photolithography process model is used for predicting a pattern's contour when the pattern is printed on the wafer.

11. A system for determining a process model for a photolithography process, wherein the photolithography process uses a first layout to subject a wafer to a first exposure-and-development process, and later uses a second layout to subject the wafer to a second exposure-and-development process, wherein when the wafer is subjected to the second exposure-and-development process, the wafer's surface includes topography variations which are created at least partly due to the first exposure-and-development process, the system comprising:

a processor; and a computer-readable storage medium storing instructions that when executed by processor cause the system to perform a method, the method comprising:

receiving process data, wherein the process data includes critical dimension measurements of patterns after the wafer is subjected to the second exposure-and-development process;

receiving an uncalibrated process model, wherein the uncalibrated process model includes a topography term which models the topography variations' influence on the second exposure-and-development process, wherein the topography term includes a first term and a second term, wherein the first term is convolved with a sum of a first layout function and a second layout function, wherein the second term is convolved with the second layout function, and wherein the first layout function represents the first layout and the second layout function represents the second layout; and determining the process model by fitting the uncalibrated process model to the process data.

12. The system of claim 11, wherein the first term and the second term model the second exposure-and-development process at different exposure depths.

13. The system of claim 11, wherein the uncalibrated process model includes a third term which models the second exposure-and-development process without taking into account the topography variations' influence, wherein the first term, the second term, and the third term are represented using weighted sums of Zernike polynomials, and wherein the third term uses at least one Zernike polynomial that is of a higher order than the first term's Zernike polynomials and the second term's Zernike polynomials.

14. The system of claim 11, wherein the photolithography process model is used during optical proximity correction.

15. The system of claim 11, wherein the photolithography process model is used for predicting a pattern's contour when the pattern is printed on the wafer.

* * * * *